United States Patent
Ma et al.

(10) Patent No.: US 6,406,947 B1
(45) Date of Patent: Jun. 18, 2002

(54) METHOD OF MAKING A LOW LEAKAGE DYNAMIC THRESHOLD VOLTAGE MOS (DTMOS) TRANSISTOR

(75) Inventors: Yanjun Ma, Vancouver; Sheng Teng Hsu, Camas, both of WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/740,126

(22) Filed: Dec. 18, 2000

(51) Int. Cl.$^7$ ................................................ H01L 21/00
(52) U.S. Cl. ....................................................... 438/149
(58) Field of Search ................................ 438/149, 151, 438/155; 257/347, 368, 385, 401

(56) References Cited

U.S. PATENT DOCUMENTS 6,255,704 B1 * 7/2001 Iwata et al.

OTHER PUBLICATIONS

Kotaki, H. et al. "Novel bulk dynamic threshold voltage MOSFET (B–DTMOSO with advanced isolation (SITOS) and gate to shallow well contact (SSS–C) processes for ultra low power CMOS", IEDM Technical Digest, IEEE, 1996, pp. 459–462.*

Article entitled, "A Dynamic Threshold Voltage MOSFET (DTMOS) for Ultra–Low Voltage Operation", by F. Assaderaghi, D. Sinitsky, S. Parke, J. Boker, P. K. Ko and C. Hu, published in 1994 IEEE, pp. 33.1.1 to 33.1.4.

* cited by examiner

Primary Examiner—Keith Christianson
(74) Attorney, Agent, or Firm—David C. Ripma; Matthew D. Rabdau; Scott C. Krieger

(57) ABSTRACT

A method of fabricating a dynamic threshold voltage metal oxide semiconductor (DTMOS) for operation at threshold voltages less than 0.6 volts includes preparing a silicon substrate to form a trench in an active area; forming a silicon layer in the trench; doping the silicon layer in the trench to form a highly doped layer, having a doping ion concentration in a range of between about $5.0 \cdot 10^{17}$ cm$^{-3}$ and $5.0 \cdot 10^{18}$ cm$^{-3}$; depositing a silicon layer over the high doped silicon layer; and completing the structure to form a DTMOS transistor.

23 Claims, 2 Drawing Sheets

METHOD OF MAKING A LOW LEAKAGE DYNAMIC THRESHOLD VOLTAGE MOS (DTMOS) TRANSISTOR

FIELD OF THE INVENTION

This invention relates to MOS Transistor and IC fabrication methods, and specifically to the fabrication of a low leakage dynamic threshold voltage metal oxide semiconductor (DTMOS) transistor on separation-by-implantation-of-oxygen (SIMOX) silicon or bulk silicon.

BACKGROUND OF THE INVENTION

A dynamic threshold voltage MOS (DTMOS) has been proposed in A dynamic threshold voltage MOSFET (DEMOS) for ultra-low voltage operation, by F. Assaderaghi et al., IEDM 94, 809 (1994), as providing a structure which will reduce the subthreshold swing in MOS devices. However, in most instances, the leakage current from the back bias to the source and to the drain will be high, and it is not possible to limit the operational voltage of such device to below 0.6 V. Operation at a voltage below 0.6V is desirable because such operation requires less power supply voltage.

SUMMARY OF THE INVENTION

A method of fabricating a dynamic threshold voltage metal oxide semiconductor (DTMOS) for operation at threshold voltages less than 0.6 volts includes preparing a silicon substrate to form a trench in an active area; forming a silicon layer in the trench, doping the silicon layer in the trench to form a highly doped layer, having a doping ion concentration in a range of between about $5.0 \cdot 10^{17}$ cm$^{-3}$ and $5.0 \cdot 10^{18}$ cm$^{-3}$, depositing a silicon layer over the high doped silicon layer; and completing the structure to form a DTMOS transistor.

An object of the invention is to reduce the leakage currents of the DTMOS so that operational voltages lower than 0.6 are possible.

Another object of the invention is to construct a device according to the method of the invention which will reduce the junction capacitance thereof.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

An n-channel metal oxide semiconductor (MOS) transistor is used as an example to illustrate the method of the invention. The same process, with proper replacement in silicon dopant, is applicable to p-channel transistors and for CMOS IC fabrication. The initial fabrication is performed on a separation-by-implantation-of-oxygen (SIMOX) silicon substrate, while another embodiment of the invention illustrates fabrication of a dynamic threshold voltage MOS (DTMOS) on a bulk silicon substrate.

Figure 1:
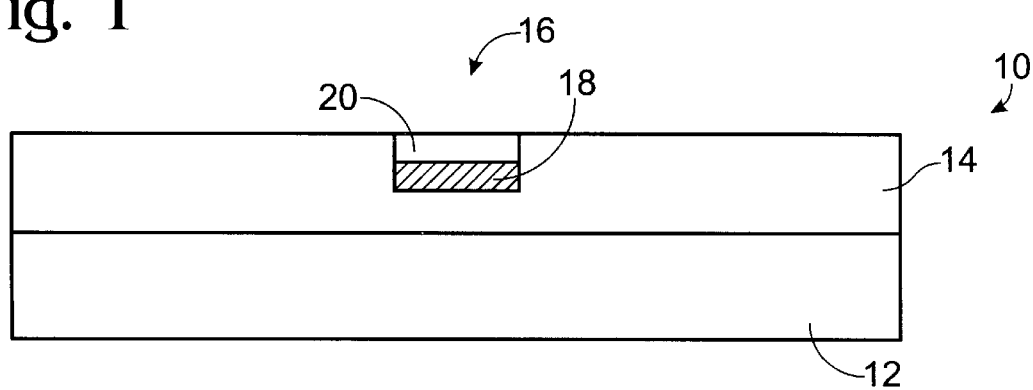
FIG. 1 depicts an initial step in the fabrication of a device in accordance with the method of the invention.

Any state-of-the-art process may be used to form the structure shown generally at 10 in FIG. 1. Structure 10 includes a SIMOX silicon substrate 12, and an oxide layer 14. A photo mask is used to protect the channel region 16 of the device. The remaining portion of the top silicon is etched and refilled with oxide using a process such as shallow trench isolation (STI). A deep, highly p-doped layer 18, also referred to herein as a body-bias region, is formed by boron ion implantation, having a dose of between about $1.0 \cdot 10^{12}$ cm$^{12}$ to $5.0 \cdot 10^{13}$ cm$^{-2}$, at an energy level of between about 20 keV to 30 keV. The doping density at the bottom of channel region 16 is in the order of $5.0 \cdot 10^{17}$ cm$^{-3}$ to $5.0 \cdot 10^{18}$ cm$^{-3}$. A silicon layer 20 is formed over highly p-doped layer 18. The top silicon film 20 is lightly doped with BF$_2$ ions at a dose of between about $1 \cdot 10^{11}$ cm$^{-2}$ and $5 \cdot 10^{12}$ cm$^{-2}$, at an energy level of between about 10 keV and 30 keV, and has a thickness of between about 100 nm to 200 nm.

Figure 2:
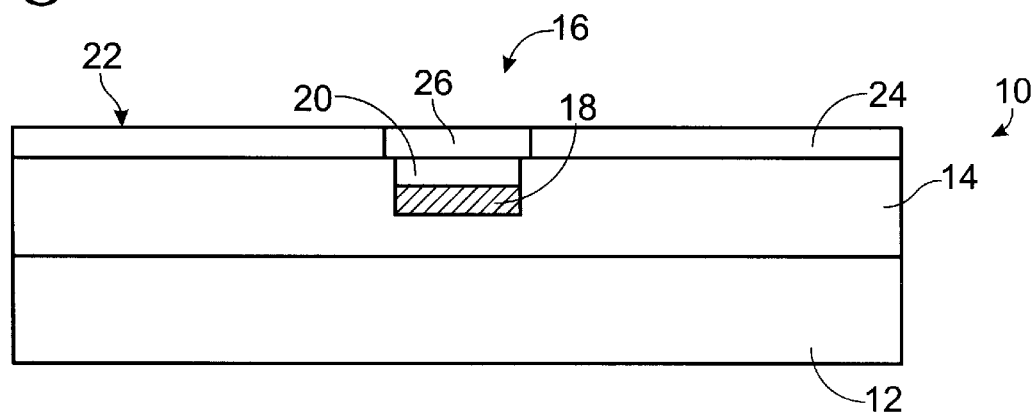
FIG. 2 depicts a thick silicon layer formed on the structure of FIG. 1.

Referring now to FIG. 2, a relatively thick silicon layer 22 is grown on the upper surface of structure 10, to a thickness of about 300 Å to 700 Å. The growth temperature is from 700° C. to 900° C. In this embodiment, polysilicon 24 is grown onto the oxide surface while single crystal silicon 26 is grown onto the surface of silicon layer 20.

Figure 3:
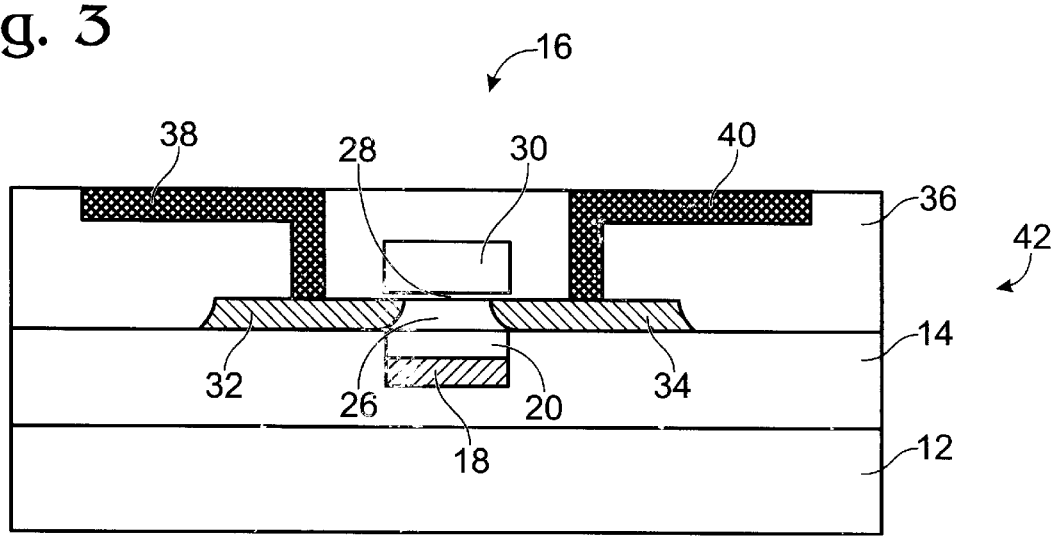
FIG. 3 depicts an n-channel DTMOS formed according to the method of the invention on a SIMOX substrate.

Turning to FIG. 3, an active area is defined, such as by mesa etch. The gate threshold is adjusted by doping, with BF$_2$ ions at a dose of between about $1 \cdot 10^{11}$ cm$^{-2}$ and $5 \cdot 10^{12}$ cm$^{-2}$, at an energy level of between about 10 keV and 30 keV, and channel region 16 is oxidized to form a gate oxide 28, followed by gate electrode 30 formation, and implantation to form source 32 and drain 34, with implantation of arsenic ions at a dose of between about $5 \cdot 10^{14}$ cm$^{-2}$ and $5 \cdot 10^{15}$ cm$^{-2}$, at an energy level of between about 30 keV and 60 keV. Contact between the polysilicon gate and body bias region 18 is made by the first level metallization. A top oxide layer 36 is deposited, and a source electrode 36 and a drain electrode 38 are formed, resulting in the final DTMOS structure 42, as shown in FIG. 3.

An important consideration in the practice of the method of the invention is the proper choice of the thickness of the epi-silicon layer 20, which should be made thinner than the depletion width under the channel of the device during operations. This eliminates direct contact between the source/drain regions and the body bias region, resulting in only minimal leakage.

Figure 4:
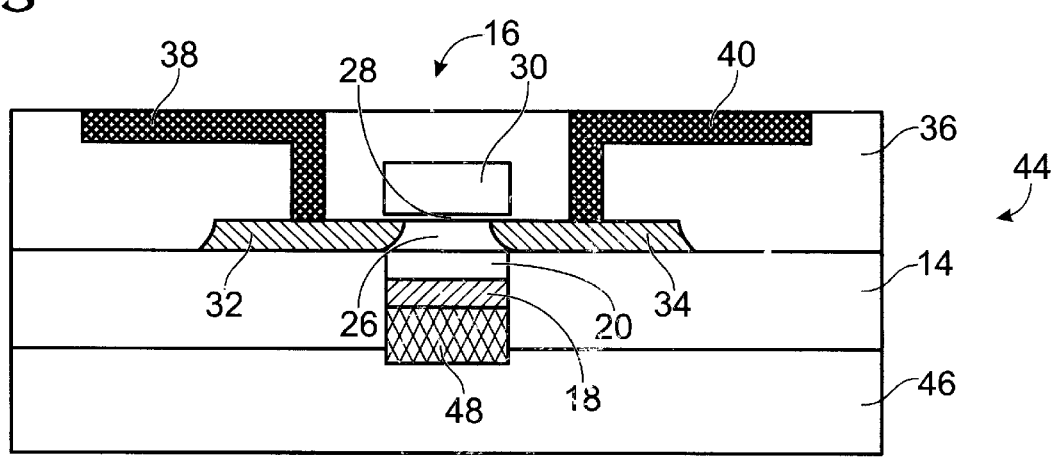
FIG. 4 depicts an n-channel DTMOS formed according to the method of the invention on a bulk silicon substrate.

The bulk version of the DTMOST is shown generally at 44 in FIG. 4, and is formed similarly to DTMOS 42, however, the depth of the STI is from about 300 nm to 1000 nm, and, in addition to highly p-doped region 18, a deep phosphorus ion implantation is made to form a highly n-doped layer 48 below layer 18. The phosphorus ion energy is about 80 keV to 150 keV, and the phosphorus dose is between about $5.0 \cdot 10^{12}$ cm$^{-2}$ to $5.0 \cdot 10^{13}$ cm$^{-2}$. The remainder of the process is identical to that used to form the device on SIMOX. Deep n-layer 48 is required for channel isolation. The doping density of the deep n-layer is between about $1.0 \cdot 10^{17}$ cm$^{-3}$ to $5.0 \cdot 10^{18}$ cm$^{-3}$.

During normal operation, the deep n-layer to substrate is reverse biased. The leakage current is relatively low, on the order of $10^{-15}$ amp/$\mu$m$^2$. DTMOST structures formed according to the method of the invention have very small input leakage current, and may be operated at low voltages, e.g., 0.6V or less.

To summarize, the gate of structures constructed according to the method of the invention may be heavily doped polysilicon or metal. Although an n-channel MOS transistor is used as an example, the structure and fabrication process is also applicable to p-channel MOS transistors and CMOS integration. The bottom substrate may be either bulk p-type silicon or SIMOX.

Thus, a method of making a low leakage dynamic threshold voltage MOS (DTMOS) transistor has been disclosed. It will be appreciated that further variations and modifications thereof may be made within the scope of the invention as defined in the appended claims.

We claim:

1. A method of fabricating a dynamic threshold voltage metal oxide semiconductor (DTMOS) comprising:
   preparing a silicon substrate to form a trench in an active area;
   forming a silicon layer in the trench;
   doping the silicon layer in the trench to form a highly doped layer, having a doping ion concentration in a range of between about $5.0 \cdot 10^{17}$ cm$^{-3}$ and $5.0 \cdot 10^{18}$ cm$^{-3}$;
   depositing a silicon layer over the high doped silicon layer; and
   completing the structure to form a DTMOS transistor.

2. The method of claim 1 wherein said doping includes implanting boron ions in a dose of between about $1.0 \cdot 10^{12}$ cm$^{-2}$ to $5.0 \cdot 10^{13}$ cm$^{-2}$, at an energy level of between about 20 keV to 30 keV.

3. The method of claim 1 wherein said depositing a silicon layer over the highly doped silicon layer includes depositing a silicon layer to a thickness of between about 300 Å to 700 Å.

4. The method of claim 1 wherein said preparing includes forming a top silicon film to a thickness of between about 100 nm to 200 nm, and lightly doping the top silicon film with ions at a dose of between about $1 \cdot 10^{11}$ cm$^{-2}$ and $5 \cdot 10^{12}$ cm$^{-2}$, at an energy level of between about 10 keV and 20 keV.

5. The method of claim 1 wherein said preparing includes preparing a separation-by-implantation-of-oxygen (SIMOX) silicon substrate.

6. The method of claim 1 wherein said preparing includes preparing a bulk silicon substrate.

7. The method of claim 6 which further includes forming a highly n-doped layer below the highly doped silicon layer.

8. The method of claim 7 wherein said forming a highly n-doped layer below the highly doped silicon layer includes implanting phosphorus ions at a dose of between about $5.0 \cdot 10^{12}$ cm$^{-2}$ to $5.0 \cdot 10^{13}$ cm$^{-2}$ and an energy level of between about 80 keV to 150 keV, resulting in a phosphorous ion concentration of between about $1.0 \cdot 10^{17}$ cm$^{-3}$ to $5.0 \cdot 10^{18}$ cm$^{-3}$.

9. The method of claim 1 wherein said completing includes:
   defining, in the active area, a gate region, a source region and a drain region;
   adjusting the gate region threshold to provide operational voltages less than or equal to 0.6 volts;
   oxidizing the gate region;
   forming a gate electrode, a source electrode and a drain electrode; and
   depositing an oxide insulation layer.

10. A method of fabricating a dynamic threshold voltage metal oxide semiconductor (DTMOS) comprising:
    preparing a silicon substrate to form a trench in an active area;
    forming a silicon layer in the trench;
    doping the silicon layer in the trench to form a highly doped layer, having a doping ion concentration in a range of between about $5.0 \cdot 10^{17}$ cm$^{-3}$ and $5.0 \cdot 10^{18}$ cm$^{-3}$;
    depositing a silicon layer over the high doped silicon layer; and
    completing the structure to form a DTMOS transistor, wherein said completing includes:
      defining, in the active area, a gate region, a source region and a drain region;
      adjusting the gate region threshold to provide operational voltages less than or equal to 0.6 volts;
      oxidizing the gate region;
      forming a gate electrode, a source electrode and a drain electrode; and
      depositing an oxide insulation layer.

11. The method of claim 10 wherein said doping includes implanting boron ions in a dose of between about $1.0 \cdot 10^{12}$ cm$^{-2}$ to $5.0 \cdot 10^{13}$ cm$^{-2}$, at an energy level of between about 20 keV to 30 keV.

12. The method of claim 10 wherein said depositing a silicon layer over the highly doped silicon layer includes depositing a silicon layer to a thickness of between about 300 Å to 700 Å.

13. The method of claim 10 wherein said preparing includes forming a top silicon film to a thickness of between about 100 nm to 200 nm, and lightly doping the top silicon film with BF$_2$ ions at a dose of between about $1.1 \cdot 10^{11}$ cm$^{-2}$ and $5 \cdot 10^{12}$ cm$^{-2}$, at an energy level of between about 10 keV and 30 keV.

14. The method of claim 10 wherein said preparing includes preparing a separation-by-implantation-of-oxygen (SIMOX) silicon substrate.

15. The method of claim 10 wherein said preparing includes preparing a bulk silicon substrate.

16. The method of claim 15 which further includes forming a highly n-doped layer below the highly doped silicon layer.

17. The method of claim 16 wherein said forming a highly n-doped layer below the highly doped silicon layer includes implanting phosphorus ions at a dose of between about $5.0 \cdot 10^{12}$ cm$^{-2}$ to $5.0 \cdot 10^{13}$ cm$^{-2}$, and an energy level of between about 80 keV to 150 keV, resulting in a phosphorous ion concentration of between about $1.0 \cdot 10^{17}$ cm$^{-3}$ to $5.0 \cdot 10^{18}$ cm$^{-3}$.

18. A method of fabricating a dynamic threshold voltage metal oxide semiconductor (DTMOS) comprising:
    preparing a silicon substrate to form a trench in an active area;
    forming a silicon layer in the trench;
    doping the silicon layer in the trench to form a highly doped body-bias region, including implanting boron ions in a dose of between about $1.0 \cdot 10^{12}$ cm$^{-2}$ to $5.0 \cdot 10^{13}$ cm$^{-2}$, at an energy level of between about 20 keV to 30 keV resulting in a doping ion concentration in a range of between about $5.0 \cdot 10^{17}$ cm$^{-3}$ and $5.0 \cdot 10^{18}$ cm$^{-3}$;
    depositing a silicon layer over the body-bias region to a thickness of between about 300 Å to 700 Å; and
    completing the structure to form a DTMOS transistor.

19. The method of claim 18 wherein said preparing includes forming a top silicon film to a thickness of between about 100 nm to 200 nm, and lightly doping the top silicon film with $BF_2$ ions at a dose of between about $1 \cdot 10^{11}$ $cm^{-2}$ and $5 \cdot 10^{12}$ $cm^{-2}$, at an energy level of between about 10 keV and 30 keV.

20. The method of claim 18 wherein said preparing includes preparing a separation-by-implantation-of-oxygen (SIMOX) silicon substrate.

21. The method of claim 18 wherein said preparing includes preparing a bulk silicon substrate and forming a highly n-doped layer below the body-bias region.

22. The method of claim 21 wherein said forming a highly n-doped layer below the body-bias region includes implanting phosphorus ions at a dose of between about $5.0 \cdot 10^{12}$ $cm^{-2}$ to $5.0 \cdot 10^{13}$ $cm^{-2}$, and an energy level of between about 80 keV to 150 keV, resulting in a phosphorous ion concentration of between a out $1.0 \cdot 10^{17}$ $cm^{-3}$ to $5.0 \cdot 10^{18}$ $cm^{-3}$.

23. The method of claim 18 wherein said completing includes:

defining, in the active area, a gate region, a source region and a drain region;

adjusting the gate region threshold to provide operational voltages less than or equal to 0.6 volts;

oxidizing the gate region, forming a gate electrode, a source electrode and a drain electrode; and depositing an oxide insulation layer.

* * * * *